United States Patent [19]

Okamoto et al.

[11] Patent Number: 5,063,435
[45] Date of Patent: Nov. 5, 1991

[54] SEMICONDUCTOR DEVICE

[75] Inventors: Satoru Okamoto, Hyogo; Kazufumi Terazi, Tokyo; Seiichi Nishino, Tokyo; Manabu Bonkohara, Tokyo, all of Japan

[73] Assignees: Sumitomo Electric Industries, Ltd., Osaka; NEC Corporation, Tokyo, both of Japan

[21] Appl. No.: 441,356

[22] Filed: Nov. 22, 1989

Related U.S. Application Data

[63] Continuation of Ser. No. 144,092, Jan. 15, 1988, abandoned.

[30] Foreign Application Priority Data

Jan. 16, 1987 [JP] Japan ................................ 62-7686

[51] Int. Cl.$^5$ ............................................ H01L 73/02
[52] U.S. Cl. .................................. 357/74; 357/73; 357/74; 357/79
[58] Field of Search .............................. 357/74, 73, 79

[56] References Cited

U.S. PATENT DOCUMENTS

| 3,994,430 | 11/1976 | Cusano et al. | 357/79 |
| 4,524,238 | 6/1985 | Butt | 357/74 |
| 4,745,036 | 5/1988 | Trevison et al. | 357/71 |
| 4,784,972 | 11/1988 | Hatada | 357/69 |
| 4,855,808 | 8/1989 | Tower et al. | 357/73 |

FOREIGN PATENT DOCUMENTS

| 58-67049 | 4/1983 | Japan . |
| 60-136341 | 7/1985 | Japan . |
| 61-168247 | 7/1986 | Japan . |

OTHER PUBLICATIONS

Patent Abstracts of Japan, vol. 5, No. 91 (E-61) [763], 13th Jun. 1981; & JP-A-56 37656 (Nippon Denki), 11-04-1981.
Patent Abstracts of Japan, vol. 10, No. 317 (E-449) [2373], 28th Oct. 1986; & JP-A-61 127 155 (Sumitomo Electric Indu. Ltd.), 14-06-1986.
Patent Abstracts of Japan, vol. 8, No. 127 (E-250) [1564], 14th Jun. 1984; & JP-A-59 36947 (Mitsubishi Denki K.K.), 29-02-1984.

*Primary Examiner*—Eugene R. LaRoche
*Assistant Examiner*—R. Ratliff
*Attorney, Agent, or Firm*—Cushman, Darby & Cushman

[57] ABSTRACT

The present invention relates to a semiconductor casing which permits transmitting ultraviolet rays to a semiconductor chip within the casing. The semiconductor casing includes the substrate formed by a thin metal plate for mounting the semiconductor chip, a ceramic frame fixed to the periphery of the substrate, a ceramic cap which covers the semiconductor chip, is mounted on the ceramic frame and allows transmission of ultraviolet rays, and leads which are sandwiched between the ceramic frame and the ceramic cap to allow the electrical connection of the semiconductor chip.

11 Claims, 1 Drawing Sheet

SEMICONDUCTOR DEVICE

This is a continuation of application Ser. No. 07/144,092, filed Jan. 15, 1988, which was abandoned upon the filing hereof.

FIELD OF THE INVENTION

The present invention generally relates to semiconductor devices, and particularly relates to a casing (package) for a semiconductor device having a thin structure for a memory card, an IC card, or the like.

DESCRIPTION OF THE PRIOR ART

A variety of semiconductor casings are known which are thin so that they can be mounted on a memory card, an IC card, or the like and are strong. Further, where an ultraviolet ray erasable programmable ROM is incorporated in the card, it is desirable that the semiconductor casing be of the ultraviolet ray transmitting type so that rewriting the ROM memory is possible.

However, the prior art ultraviolet ray transmitting semiconductor casings have been mainly of the DIP type, for example, a semiconductor casing in which ultraviolet ray transmitting glass is embedded in a part of a ceramic cap as shown in FIG. 3 or a semiconductor casing in which semiconductor elements are mounted on an insulating substrate and sealed by ultraviolet ray transmitting resin as shown in FIG. 4.

In the prior art semiconductor casing illustrated in FIG. 3, semiconductor chips 24 are die-bonded or mounted in central recess portions of a ceramic mounting substrate 22 using a bonding agent 25, such as a metal soldering material or glass. Bonding wires 27 are bonded at one end to the semiconductor chips 24 and bonded at the other end to metallized conductors (not shown) formed on the ceramic mounting substrate 22. The metallized conductors (not shown) extend to the side surfaces of the ceramic mounting substrate 22. Leads 26 are fixed to the side surfaces. A ceramic cap 23 having pieces of ultraviolet ray transmitting glass 28 embedded therein at portions corresponding to the semiconductor chips 24 is put on the top portion of the ceramic mounting substrate 22 and sealed with a metal soldering material or glass.

The prior art semiconductor casing illustrated in FIG. 4 is provided with a semiconductor chip 32 fixed on an insulating substrate 31 by a bonding agent 36. The semiconductor chip 32 is connected to leads 34 formed on the substrate 31 through bonding wires 33. Ultraviolet ray transmitting resin 35 is applied to the chips 32 and the bonding wires 33 to cover them completely.

In the case of the conventional DIP type semiconductor casing illustrated in FIG. 3, the ceramic mounting substrate is produced generally through powder molding. It has therefore been difficult to produce a thin ceramic substrate. Further, even if a thin ceramic substrate can be produced, it is difficult to give sufficient mechanical strength to the substrate. This also applies when the element mounting substrate 22 is made of an alumina ceramic green sheet.

In the semiconductor casing shown in FIG. 4, sealing is performed with ultraviolet ray transmitting resin after the elements have been mounted on the insulating substrate. Therefore, the resin must be thick enough to obtain predetermined mechanical strength and moisture resistance. Because this thickness is necessary, it has been difficult to realize a thin semiconductor casing.

It is therefore an object of the present invention to provide a thin semiconductor casing which has the necessary mechanical strength and moisture resistance.

SUMMARY OF THE INVENTION

According to the present invention, an ultraviolet ray transmitting semiconductor casing has a thin metal plate which is used as a package substrate, an ultraviolet ray transmitting ceramic cap, preferably alumina, and leads sandwiched between the ceramic frame and the cap so that an airtight seal using low melting-point glass is obtained. Accordingly, it is possible to easily make the semiconductor casing extremely thin compared to the prior art and still strong because of the thin metal plate. Also, moisture resistance is improved because of the airtight sealing using low melting-point glass. This improves the reliability of the casing.

Furthermore, the leads are shaped before airtight sealing. This prevents cracks, splits or the like which may be generated if the leads are shaped after airtight sealing.

BRIEF DESCRIPTION OF THE DRAWINGS

These and other advantages of the present invention may be appreciated from studying the following detailed description of the preferred embodiment together with the drawings in which.

DETAILED DESCRIPTION OF THE PREFERRED EMBODIMENT

Figure 1:
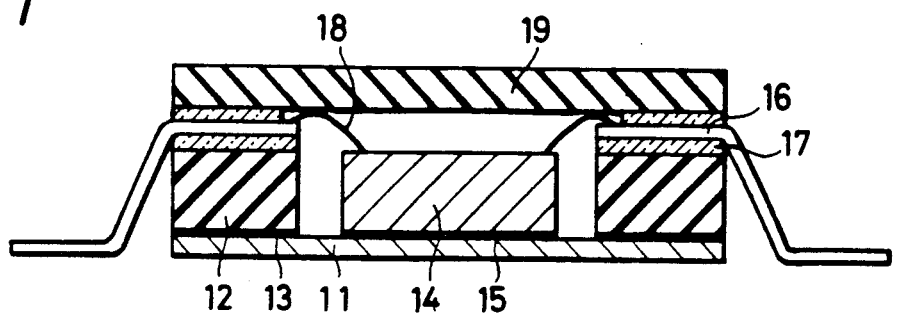
FIG. 1 is a cross section showing the structure of a first embodiment of the semiconductor casing according to the present invention.

Now, referring to the accompanying drawings, a description will be made of the preferred embodiments of the semiconductor casing according to the present invention. FIG. 1 is a cross section showing a structure of an embodiment of the semiconductor casing according to the present invention.

The semiconductor casing illustrated in the drawing is provided with a thin metal plate substrate 11 having high rigidity and a coefficient of thermal expansion approximate to that of glass or ceramics. The metal thin plate substrate 11 is made of, for example, Alloy-42 or Kovar, and is 0.04–0.05 mm thick. It should not be thicker than 0.05 mm. This enables the substrate to be thin and also possess the required mechanical strength, unlike ceramic substrates.

The thin metal plate substrate 11 is provided with a ceramic frame 12 at its circumference with a space left for mounting semiconductor chip 14. The ceramic frame 12 is formed through alumina powder molding or a doctor blade method of an alumina green sheet, and is 0.3–0.5 mm thick. The ceramic frame 12 is metallized at its lower surface and fixed to the substrate 11 by a bonding agent 13 such as an Ag-Cu soldering material or glass having a high melting point.

The semiconductor chip 14 is die-bonded or mounted onto the thin metal substrate 11 by a bonding agent 15 such as Au-Si paste, Ag paste, or the like, at a part of the substrate 11 surrounded by the ceramic frame 12.

Mounted over the ceramic frame 12 is an ultraviolet transmitting ceramic cap 19. Cap 19 is made so that ultraviolet light can pass through it, thereby enabling EPROM memory to be altered.

A plurality of leads 16 of Alloy-42 or Kovar each having a 0.03–0.1 mm thickness are radially disposed on a circumference of a top surface of the ceramic frame 12.

Leads 16 are sandwiched between the ceramic cap 19 and the ceramic frame 12 provided at a circumference of the thin metal plate substrate 11 and sealed with low melting point glass. The leads 16 are electrically insulated from each other and from the metal substrate 11 so that the leads 16 are electrically isolated from the semiconductor chip 14 fixed on the thin metal substrate 11.

The leads 16 are fixed on the ceramic frame 12 by glass 17 which has a low melting point. Therefore, the space between the ceramic frame 12 and the ceramic cap 19 can be sufficiently airtight, and sufficiently moisture resistant. In order to increase the bonding force between each lead 16 and the low melting point glass 17, an Al film (an aluminum film) is provided on the whole circumferential surface in the glass wet range of each lead 16 through a vaporizing method or a sputtering method, thereby making a very effective airtight seal and improving the moisture resistance.

The semiconductor chip 14 is connected to the corresponding leads 16 through bonding wires 18 of metal such as Au, Cu, or Al. To this end, Au, Ag, Al, or the like, is deposited to a thickness of 0.5 μm–5 μm at the wire-bonding region on each outgoing lead 16 through plating, sputtering, vaporizing, or the like.

An alumina ceramic cap 19 is fixed to the top surface of the ceramic frame 12 by using low melting point glass 17 to thereby fix the leads 16 disposed between the cap and the frame. The thickness of alumina is selected to be within a range of from 0.1 mm to 0.5 mm. This allows ultraviolet rays to transmit therethrough sufficiently. Since the cap is made of an insulation material such as ceramics, shortcircuiting will not occur even if the cap 19 touches the wires connecting the semiconductor chip 14 to the leads 16. Therefore, it is possible to make the space between the cap 19 and the semiconductor chip 14 as small as possible. Selecting the thickness of the ceramic frame 12 to correspond to that of the semiconductor chip 14 enables the casing to be made sufficiently thin.

The portion of the leads 16 outside the airtight portion are shaped in advance, substantially to the same positions as the lower surface of the package substrate, so that mounting of the semiconductor casing can be easily carried out before airtight sealing.

In such a structure, if the thickness of the low melting point glass layer 17 is selected to be 0.1–0.2 mm and the thickness of each of various members described above is suitably selected within the range described above, the thickness of the whole of the semiconductor casing can be set to a range of 0.5 mm to 1.0 mm. This results in a thin casing.

As described above, enough mechanical strength for the semiconductor casing can be obtained from the thin metal substrate 11. Accordingly, ultraviolet ray transmitting ceramics can be utilized as a material for the cap 19. Therefore, it is possible to realize a strong ultraviolet ray transmitting semiconductor casing.

Further, since the leads 16 are shaped before air tight sealing, cracks or splits which otherwise occur when the leads are shaped after airtight sealing are never generated.

Figure 2:
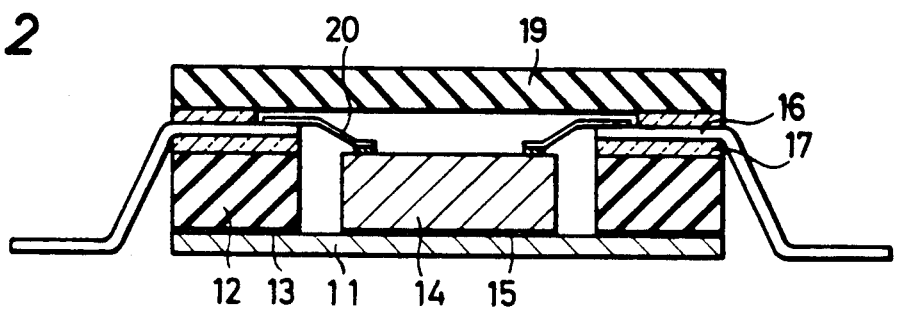
FIG. 2 is a cross section showing the structure of a second embodiment of the semiconductor casing according to the present invention.
Figure 3:
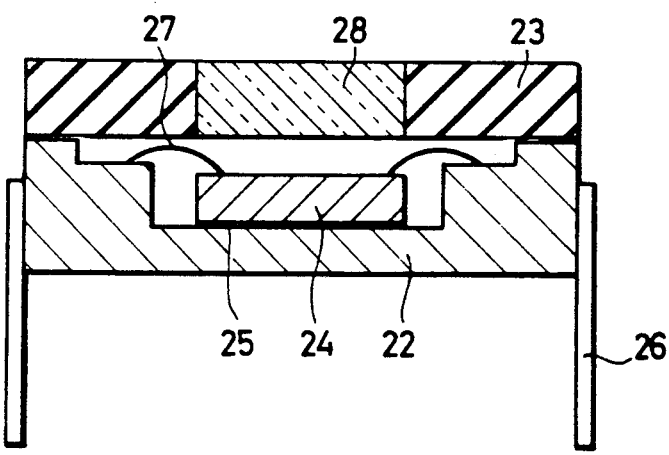
FIGS. 3 and 4 are cross sections showing prior art semiconductor casings.
Figure 4:
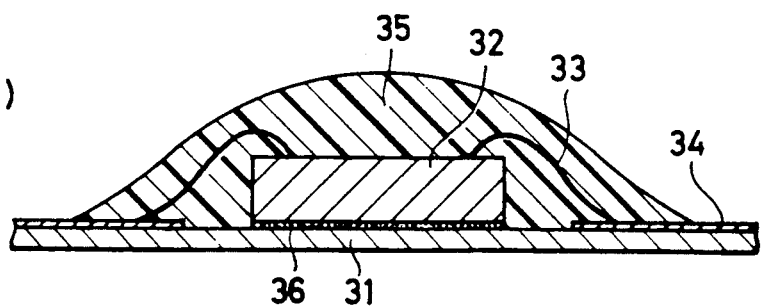

FIG. 2 is a cross section showing a structure of a second embodiment of the semiconductor casing according to the present invention. In FIG. 2, items corresponding to those in the first embodiment of FIG. 1 are correspondingly referenced and a description of them is omitted.

In the embodiment shown in FIG. 2, instead of mounting a semiconductor chip 14 having bonding wires 18 as performed in the first embodiment, the semiconductor chip has film carriers 20 mounted to it. Thus, the space of 150–250 μm required for the loops of the wire bonded to the leads 16 is unnecessary. Therefore, the thickness of the semiconductor casing can be further reduced.

What is claimed is:

1. A semiconductor casing having a total thickness no greater than 1.0 mm for use with a semiconductor device having a thin structure which permits transmission of ultraviolet rays to a semiconductor chip within said casing, said casing comprising:
   - a substrate formed by a thin metal plate having a thickness no more than 0.05 mm on which said semiconductor chip is mounted;
   - a ceramic frame fixed peripherally to said substrate, said frame having a thickness in a range of from 0.3 to 0.5 mm;
   - a ceramic cap which covers said semiconductor chip, said cap being mounted on said ceramic frame so as to allow ultraviolet rays therethrough and having a thickness between 0.1 an 0.5 mm; and
   - leads having a thickness between 0.03 and 0.1 mm sandwiched between said ceramic frame and said ceramic cap which extend outward from said substrate and which are electrically connected to said semiconductor chip.

2. An ultraviolet ray transmitting semiconductor casing according to claim 1 further including a glass of a low melting point used to form an airtight seal between said ceramic frame and said ceramic cap.

3. An ultraviolet ray transmitting semiconductor casing according to claim 1 wherein each of said leads is provided with an Al film so that at least a portion of said Al film is sealed with said glass.

4. An ultraviolet ray transmitting semiconductor casing according to claim 3 wherein the whole circumferential surface of each of said leads is provided with said Al film so that at least said portion of said Al film is sealed with said glass.

5. An ultraviolet ray transmitting semiconductor casing according to claim 1 wherein said thin metal plate is made of Alloy-42 or Kovar and is not thicker than 0.05 mm in thickness.

6. An ultraviolet ray transmitting semiconductor casing according to claim 1 wherein said ceramic frame is made of alumina and has a thickness of 0.3 mm to 0.5 mm.

7. An ultraviolet ray transmitting semiconductor casing according to claim 1 wherein said ceramic frame is fixed to said substrate by a metal soldering material or a bonding agent of high melting point glass.

8. An ultraviolet ray transmitting semiconductor casing according to claim 1 wherein said cap is made of alumina and has a thickness of 0.1 mm to 0.5 mm.

9. An ultraviolet ray transmitting semiconductor casing according to claim 1 wherein each of said leads is formed to be a predetermined shape before airtight sealing.

10. An ultraviolet ray transmitting semiconductor casing according to claim 1 wherein each of said leads include a film carrier that is electrically connected to said semiconductor chip.

11. An ultraviolet ray transmitting semiconductor casing according to claim 1 wherein said semiconductor casing has a thickness within a range of 0.5 mm to 1.0 mm.

* * * * *